United States Patent
Sato

(10) Patent No.: US 6,536,020 B2
(45) Date of Patent: Mar. 18, 2003

(54) EFFICIENT GENERATION OF OPTIMUM TEST DATA

(75) Inventor: Kazuyuki Sato, Sendai (JP)

(73) Assignee: Fujitsu Limited, Kawasaki (JP)

(*) Notice: Subject to any disclaimer, the term of this patent is extended or adjusted under 35 U.S.C. 154(b) by 224 days.

(21) Appl. No.: 09/726,991

(22) Filed: Nov. 30, 2000

(65) Prior Publication Data

US 2001/0003209 A1 Jun. 7, 2001

(30) Foreign Application Priority Data

Dec. 3, 1999  (JP) .......................................... 11-344264

(51) Int. Cl.[7] .............................................. G06F 17/50
(52) U.S. Cl. .................................. 716/4; 716/4; 716/5
(58) Field of Search .......................... 716/4, 5; 714/718, 714/724, 29, 40; 703/20, 21, 22, 23

(56) References Cited

U.S. PATENT DOCUMENTS

| | | | | |
|---|---|---|---|---|
| 4,494,191 A | * | 1/1985 | Itoh | 703/20 |
| 4,993,027 A | * | 2/1991 | McGraw et al. | 714/29 |
| 5,047,926 A | * | 9/1991 | Kuo et al. | 714/29 |
| 5,121,492 A | * | 6/1992 | Saville et al. | 703/13 |
| 5,544,311 A | * | 8/1996 | Harenberg et al. | 714/30 |
| 5,754,759 A | * | 5/1998 | Clarke et al. | 714/31 |
| 6,052,524 A | * | 4/2000 | Pauna | 703/19 |

FOREIGN PATENT DOCUMENTS

JP  9-89999  4/1997

* cited by examiner

Primary Examiner—Matthew Smith
Assistant Examiner—Binh C. Tat
(74) Attorney, Agent, or Firm—Katten Muchin Zavis Rosenman

(57) ABSTRACT

A method of generating test data for conducting a test of an LSI circuit generates the test data based on a model of the LSI circuit that has a processor therein operating based on a micro-program. The method includes the steps of ROM-modeling the micro-program which is already debugged during logic simulation that determines logic design of the LSI circuit, and debugging the micro-program and the LSI circuit by carrying out said test of an LSI circuit on the model of the LSI circuit.

7 Claims, 12 Drawing Sheets

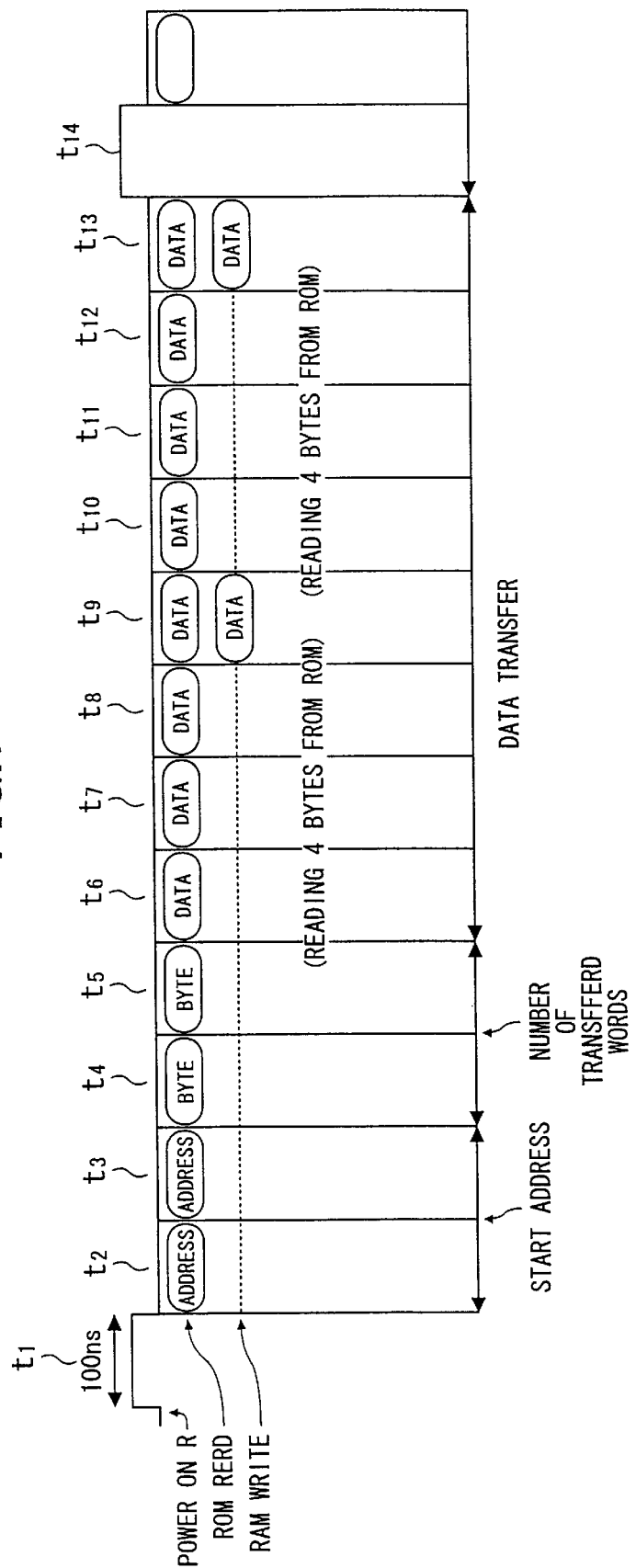

FIG.8A

| TIME PERIOD B | TIME PERIOD A |
|---|---|
| CHECK OF OPERATION OF PERIPHERAL CIRCUIT BASED ON INSTRUCTION SET STORED IN RAM | TRANSFER ROM→RAM |
| ←— 10min —→ | ←— 30min —→ |

FIG.8B

| ADDRESS | DATA STORED IN ROM (8 BIT) | | ADDRESS | DATA STORED IN RAM (32 BIT) |
|---|---|---|---|---|
| 0000 | 00000000 | → | 00000 | 00000000 |
| 00001 | 11111111 | | 00001 | NO TRANSFER |
| 00002 | 22222222 | | 00002 | 22222222 |
| 00003 | 33333333 | | 00003 | NO TRANSFER |
| 00004 | 44444444 | | 00004 | 44444444 |
| 00005 | 55555555 | | 00005 | 55555555 |
| 00006 | 66666666 | | 00006 | 66666666 |
| 00007 | 77777777 | | 00007 | NO TRANSFER |
| 00008 | 88888888 | | 00008 | 88888888 |
| 00009 | 99999999 | | 00009 | 99999999 |
| 0000A | AAAAAAAA | | 0000A | NO TRANSFER |
| 0000B | BBBBBBBB | | 0000B | NO TRANSFER |
| 0000C | CCCCCCCC | | 0000C | NO TRANSFER |
| 0000D | DDDDDDDD | | 0000D | NO TRANSFER |
| 0000E | EEEEEEEE | | 0000E | NO TRANSFER |
| 0000F | FFFFFFFF | | 0000F | FFFFFFFF |
| 00010 | ~ | | 00010 | ~ |
| ~ | ~ | | ~ | ~ |

EFFICIENT GENERATION OF OPTIMUM TEST DATA

BACKGROUND OF THE INVENTION

1. Field of the Invention

The present invention generally relates to testing of LSI circuits, and particularly relates to a method of generating optimum test data.

2. Description of the Related Art

As circuit density of LSI circuits increases, system LSI circuits are used in increasing numbers where the system LSI circuits include a microprocessor unit (MPU), an internal circuit, and a RAM, and has a micro-program stored in the RAM, which allows the microprocessor to operate in accordance with instruction codes of the micro-program, thereby controlling the internal circuit.

A system LSI circuit is a highly integrated circuit implemented as a single chip, on which the MPU, the memory, and various circuits are mounted. The greater the circuit density, the greater the size of test data necessary for conducting tests. It is necessary, therefore, to conduct an efficient test by preparing an efficient set of data no more than necessary for conducting the test.

FIG. 9 is a flowchart showing a related-art process of LSI development.

At a step ST_a, a circuit design of an LSI circuit is determined by a design engineer using a workstation. In order to check proper operation of the designed circuit in terms of operation logic, a logic simulation is carried out on the workstation (at a step ST_b). At a step ST_c, after appropriate corrections are made in response to the logic simulation, a layout of the circuit is designed by using the workstation in order to arrange various circuit elements within the circuit space. At a step ST_d, simulation of gate operations is carried out by taking into account line capacitance of the signal lines of the circuit layout. At a step ST_e, test data is generated on the workstation. Here, the test data is to be fed into a LSI tester device at a subsequent stage when the LSI tester device is used to test an actually manufactured LSI circuit. The test data indicates timings of signals, including data of input signals that are supplied to input terminals of the tested LSI circuit, and including data of output signals that are expected to be output from the output terminals of the tested LSI circuit.

When the design of the LSI circuit is completed after the process described above, data of the circuit design is released to the process of LSI-chip manufacture (e.g., released to an LSI-chip manufacturer) at a step ST_f. Here, the released data of the circuit design include circuit data, physical LSI data (e.g., regarding pins and test terminals), and the test data of an LSI tester device.

At a step STE_g, the circuit data and the LSI physical data are used in the process of manufacturing LSI chips to actually manufacture an LSI chip. At a step ST_h, the test data is fed into an LSI tester device that is commercially available. At a step ST_i, the manufactured LSI chip is set in the LSI tester device, and tests are conducted by use of the test data.

FIG. 10 is a block diagram showing an example of an LSI circuit. FIG. 11 is a flowchart of a process of generating test data for testing the LSI circuit shown in FIG. 10. A method of generating the test data for testing the LSI circuit of FIG. 10 will be described below.

In the example of the LSI circuit shown in FIG. 10, a micro-program to be executed by a microprocessor is loaded to a RAM (e.g., SRAM) of the LSI circuit when the micro-program is supplied from a ROM provided outside the LSI circuit at the time of power-on.

In FIG. 10, an LSI 80 is connected to a ROM 81 that stores a micro-program therein, and has a terminal that is used for micro loading. A power-on-reset circuit 83 supplies a power-on-reset signal. The LSI 80 is also connected to a $2^{nd}$ cache 84 and an I/O (input/output) device 85. The LSI 80 includes a micro loading circuit 80a, a set of various internal circuits 80b, a processing circuit 80c having an MPU (microprocessor unit) and an SRAM for loading a micro-program, and a set of various circuits 80d including a $1^{st}$ cache, a $1^{st}$-cache control, a $2^{nd}$-cache control, and an I/O control.

The process shown in FIG. 11 is carried out to generate test data by simulating the circuit of FIG. 10 on the workstation, and the generated test data is used for testing an actually manufactured LSI circuit.

After starting the simulation, at a step S1, a micro-program to be transferred to the LSI circuit 80 is prepared in the ROM 81. At a step S2, a power-on-reset signal is supplied to the LSI circuit 80. In response, at a step S3, the data (i.e., the micro-program) is transferred from the ROM 81 to the SRAM of the processing circuit 80c of the LSI 80. This transfer is carried out by the micro loading circuit 80a, and the micro-program is loaded to all the area of the SRAM. This micro-program is a set of instructions that are used by the MPU to operate. At a step S4, the MPU starts operation thereof by following the instructions of the micro-program stored in the SRAM. At a step S5, a check is made by using a minimum necessary set of instructions of the micro-program as to whether various circuits operate properly. At a step S6, a check is made as to whether debugging of the micro-program is completed. If there is a bug, correction is made, and, then, the procedure goes back to the step S1 followed by the series of steps S2 through S5 of the simulation. Namely, the data (i.e., the micro-program) is transferred again from the ROM 81 to the SRAM of the processing circuit 80c of the LSI 80, and a check is made with regard to the proper operation of the circuits.

The method of generating test data for a system LSI circuit as described above has drawbacks as follows.

FIGS. 12A and 12B are illustrative drawings for explaining the drawbacks of the related art.

In the related art method of generating test data, data transfer from the ROM to the RAM needs to be carried out each time the micro-program is debugged. Namely, as shown in FIG. 12A, the total time length of the simulation on the workstation is represented as (time length of data transfer from ROM to RAM+time length required for checking operation of circuits by use of instructions stored in RAM)×(the number of debugging operations).

In this case, the time length of data transfer from the external ROM to the internal RAM (SRAM) accounts for most of the simulation time. Since a series of steps of the simulation need to be repeated as many times as there are debugging operations, the total time of the simulation tends to be lengthy.

Further, the time length of data transfer itself is quite lengthy in the related-art method. Not all of the instructions of the micro-program are necessary for the purpose of conducting tests using the tester device. However, since the related-art method sequentially transfers all the micro-program contents from the ROM to the RAM, the size of data to be transferred is quite large.

FIG. 12B shows the way the data of the external ROM is transferred to and stored in the RAM area for storing a micro-program. In this example, data of four addresses in the ROM are stored at one address in the RAM. Data at each address in the ROM is comprised of 8 bits, and data at each address in the RAM is comprised of 32 bits. Not all of the data stored in the RAM are used as the test data. In this example, data (i.e., the micro-program) stored at the addresses 00001 and 00003 are not used for the test purposes.

Accordingly, there is a need for a method of generating test data for testing an LSI circuit that can generate test data efficiently, thereby shortening the simulation time and improving debugging efficiency.

SUMMARY OF THE INVENTION

It is a general object of the present invention to provide a method of generating test data that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by the method of generating test data particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a method of generating test data for conducting a test of an LSI circuit based on a model of the LSI circuit that has a processor therein operating based on a micro-program, the method including the steps of ROM-modeling the micro-program which is already debugged during logic simulation that determines logic design of the LSI circuit, and debugging the micro-program and the LSI circuit by carrying out the test of an LSI circuit on the model of the LSI circuit.

According to another aspect of the present invention, a method of generating test data for conducting a test of an LSI circuit, based on a model of the LSI circuit that has a processor therein operating based on a micro-program stored in a RAM, includes the steps of carrying out the test of an LSI circuit on the model of the LSI circuit, tracing addresses of the micro-program that are accessed during the test, and generating a control file from the traced addresses, the control file controlling data transfer of the micro-program from an external ROM to the RAM so as to transfer only a portion of the micro-program that is no more than necessary for conducting the test.

According to another aspect of the present invention, a method of generating test data for conducting a test of an LSI circuit, based on a model of the LSI circuit that has a processor therein operating based on a micro-program stored in a RAM, includes the steps of ROM-modeling the micro-program which is already debugged during logic simulation that determines logic design of the LSI circuit, carrying out the test of an LSI circuit on the model of the LSI circuit, debugging the micro-program and the LSI circuit during the test, tracing addresses of the micro-program that are accessed during the test, and generating a control file from the traced addresses, the control file controlling data transfer of the micro-program from an external ROM to the RAM so as to transfer only a portion of the micro-program that is no more than necessary for conducting the test.

In the present invention, as described above, the ROM modeling of a micro-program is performed. That is, the micro-program is treated as being stored in a ROM inside a system LSI circuit where this ROM is embodied by treating a RAM as a read-only memory during the simulation of generating test data. By doing so, the present invention eliminates a need to transfer the micro-program from an external ROM to the internal RAM each time a debugging operation is carried out.

Moreover, since the micro-program of the present invention has been already debugged during the logic simulation prior to the simulation of generating test data, the ROM model of the micro-program does not have to be debugged as extensively as otherwise. Furthermore, during the simulation of generating test data, debugging for removing remaining bugs is carried out with respect to the micro-program implemented as the ROM model.

Furthermore, the control file for controlling the transfer of micro-program from the external ROM to the internal ROM is generated from addresses traced during simulation of LSI testing. Use of this control file makes it possible to transfer only the data of the micro-program that is no more than necessary for the LSI testing.

BRIEF DESCRIPTION OF THE DRAWINGS

FIG. 7 is a timing chart indicative of operation of a micro-loading unit;

FIGS. 8A and 8B are illustrative drawings for explaining shortening of a simulation time;

DESCRIPTION OF THE PREFERRED EMBODIMENTS

In the following, embodiments of the present invention will be described with reference to the accompanying drawings.

Figure 1:
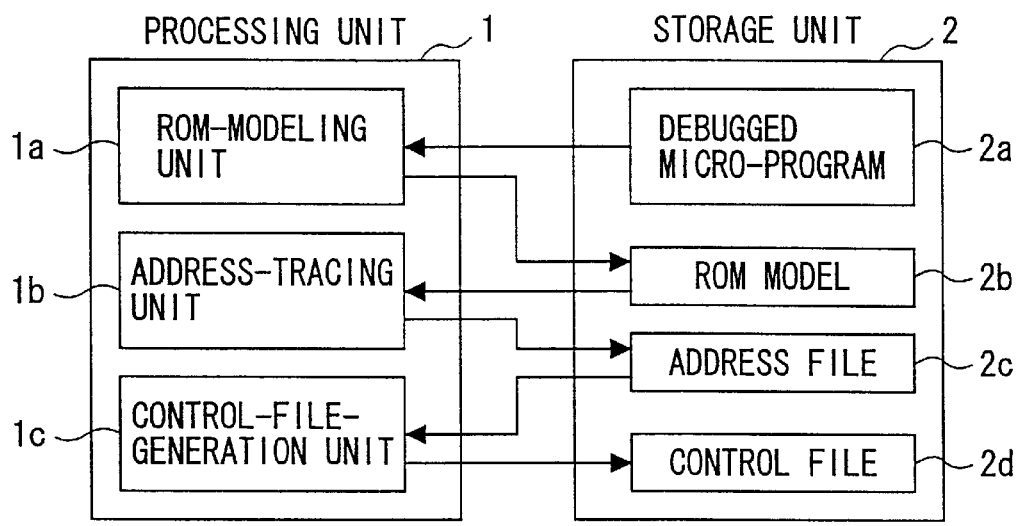
FIG. 1 is a block diagram showing an apparatus for generating test data according to the present invention.

FIG. 1 is a block diagram showing an apparatus for generating test data according to the present invention.

The apparatus of FIG. 1 includes a processing unit 1 and a storage unit 2. The processing unit 1 generates optimum test data, and includes a ROM-modeling unit 1*a*, an address-tracing unit 1*b*, and a control-file-generation unit 1*c*. The ROM-modeling unit 1a carries out ROM modeling of a micro-program that has been checked during a logic simulation. The address-tracing unit 1b generates addresses of necessary micro-program instructions by performing program tracing, and stores an address file indicative of these addresses. The control-file-generation unit 1c generates a control file including input/output data to be used by the tester by referring to the traced addresses. The storage unit 2 stores programs, data, and addresses, and includes a micro-program 2a, a ROM model 2b, an address file 2c, and a control file 2d. The micro-program 2a has been already checked (i.e., debugged) during the preceding logic simulation. The address file 2c includes the traced addresses. The control file 2d includes data of the signals that are supplied to or appear at the terminals of the tester.

Figure 9:
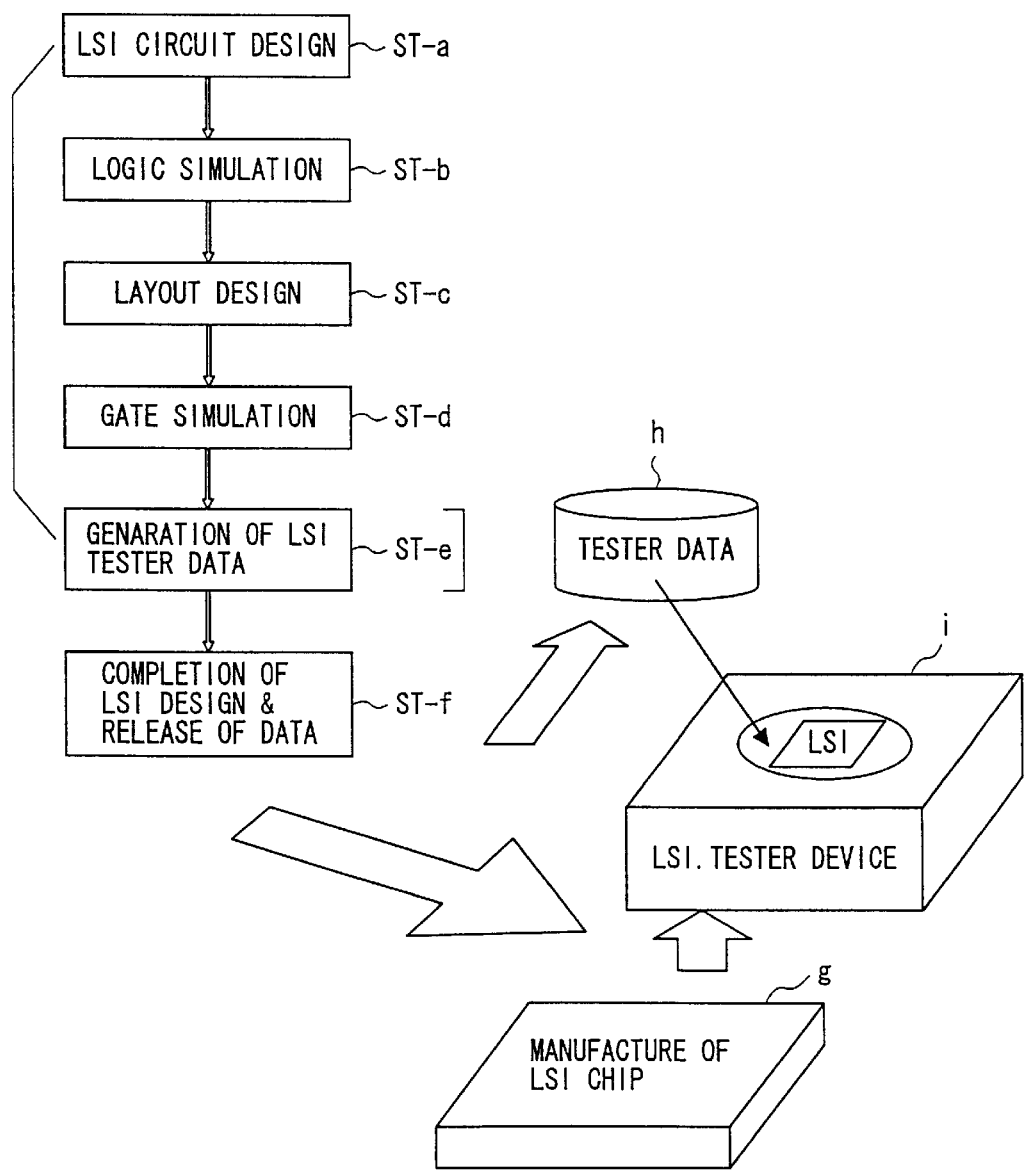
FIG. 9 is a flowchart showing a related-art process of LSI development.
Figure 10:
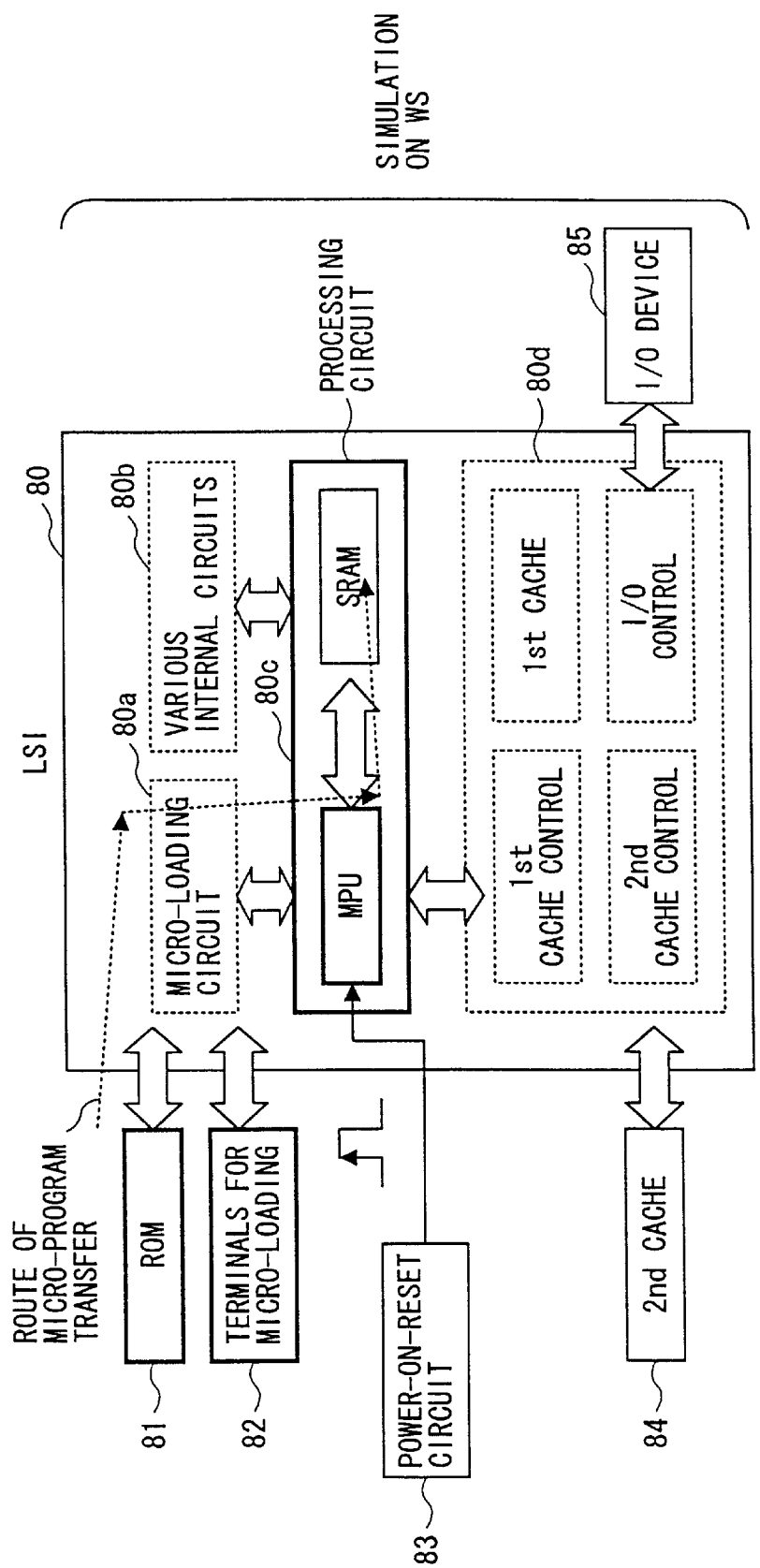
FIG. 10 is a block diagram showing an example of an LSI circuit.
Figure 11:
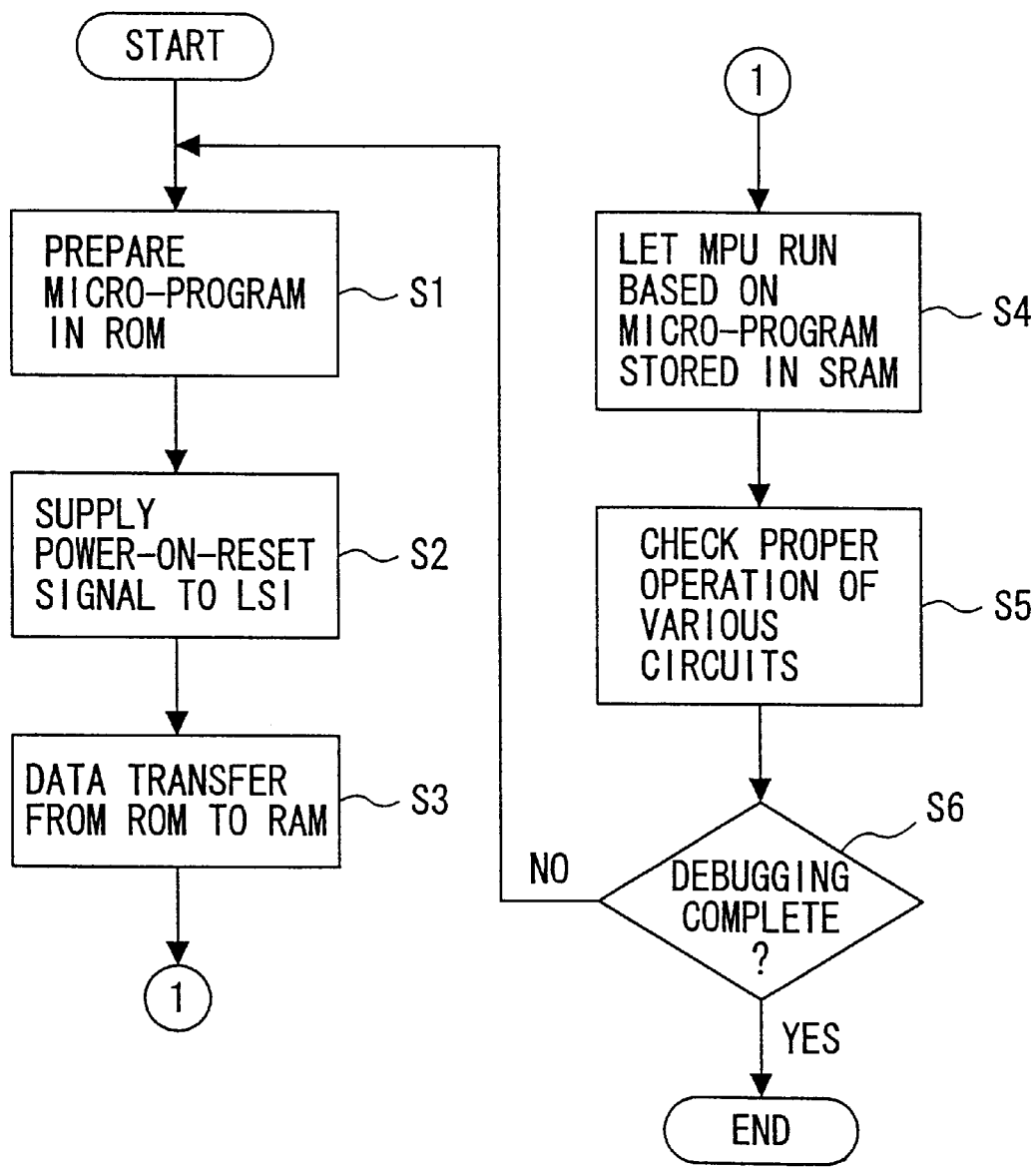
FIG. 11 is a flowchart of a process of generating test data for testing the LSI circuit of FIG. 10.

The present invention is embodied by implementing each unit and file as described above on an information-processing device such as a workstation As described in connection with FIG. 9, a logic simulation (ST_b) is carried out during the design process of a system LSI circuit in order to check circuit operation in terms of operation logic thereof. This is a check to find logic errors in the designed circuit. If errors are found, corrections are made at this stage of the process. The ROM-modeling unit 1a performs ROM modeling of such a micro-program as have been already debugged by the logic simulation, and generates the ROM model 2b. The address-tracing unit 1b traces the addresses of the micro-program that are accessed during a period for which a test for testing the system LSI circuit is conducted. The extracted addresses are stored as the address file 2c, which identifies addresses of micro-program instructions that are necessary for the testing of the LSI circuit. The control-file-generation unit 1c erases duplicate addresses when some addresses appear twice or more, and sorts the addresses in an order of addresses. The control-file-generation unit 1c generates the control file 2d by specifying the addresses no more than necessary for conducting the test by the LSI tester.

As described above, the ROM modeling of a micro-program generates the ROM model 2b. That is, the micro-program is treated as being stored in a ROM inside a system LSI circuit where this ROM is embodied by treating a RAM as a read-only memory during the simulation of generating test data. In the related art, the micro-program is stored in the external ROM, and is transferred to the internal RAM to be executed by the MPU. Through the ROM modeling of a micro-program, on the other hand, the present invention treats the micro-program as residing in an internal ROM that is created by treating the internal RAM as a read-only memory. By doing so, the present invention eliminates a need to transfer the micro-program from the external ROM to the internal RAM each time a debugging operation is carried out.

Moreover, since the micro-program of the present invention has been already debugged during the logic simulation prior to the simulation of generating test data, the ROM model of the micro-program does not have to be debugged as extensively as otherwise. Even in the related art, some debugging of the micro-program is carried out during the logic simulation, so that only one hundredth as many debugging operations as in the logic simulation may be necessary at the time of generating test data. In the present invention, however, the debugging during the logic simulation prior to the simulation of generating test data is performed as thoroughly as possible. Furthermore, during the simulation of generating test data, debugging for removing remaining bugs is carried out with respect to the micro-program implemented as the ROM model. Since there is no need for data transfer from the external ROM to the internal RAM, the time length of the simulation will be greatly reduced in the method of generating test data according to the present invention.

In this manner, the control data is generated by using only the data that is no more than necessary for conducting testing, and the micro-program that has been already debugged is treated as a ROM model during the process of generating test data. This insures that optimum test data is generated in an efficient manner, thereby reducing the time length of simulation on the workstation and shortening the test time for testing an actual LSI circuit by use of the LSI tester.

Figure 2:
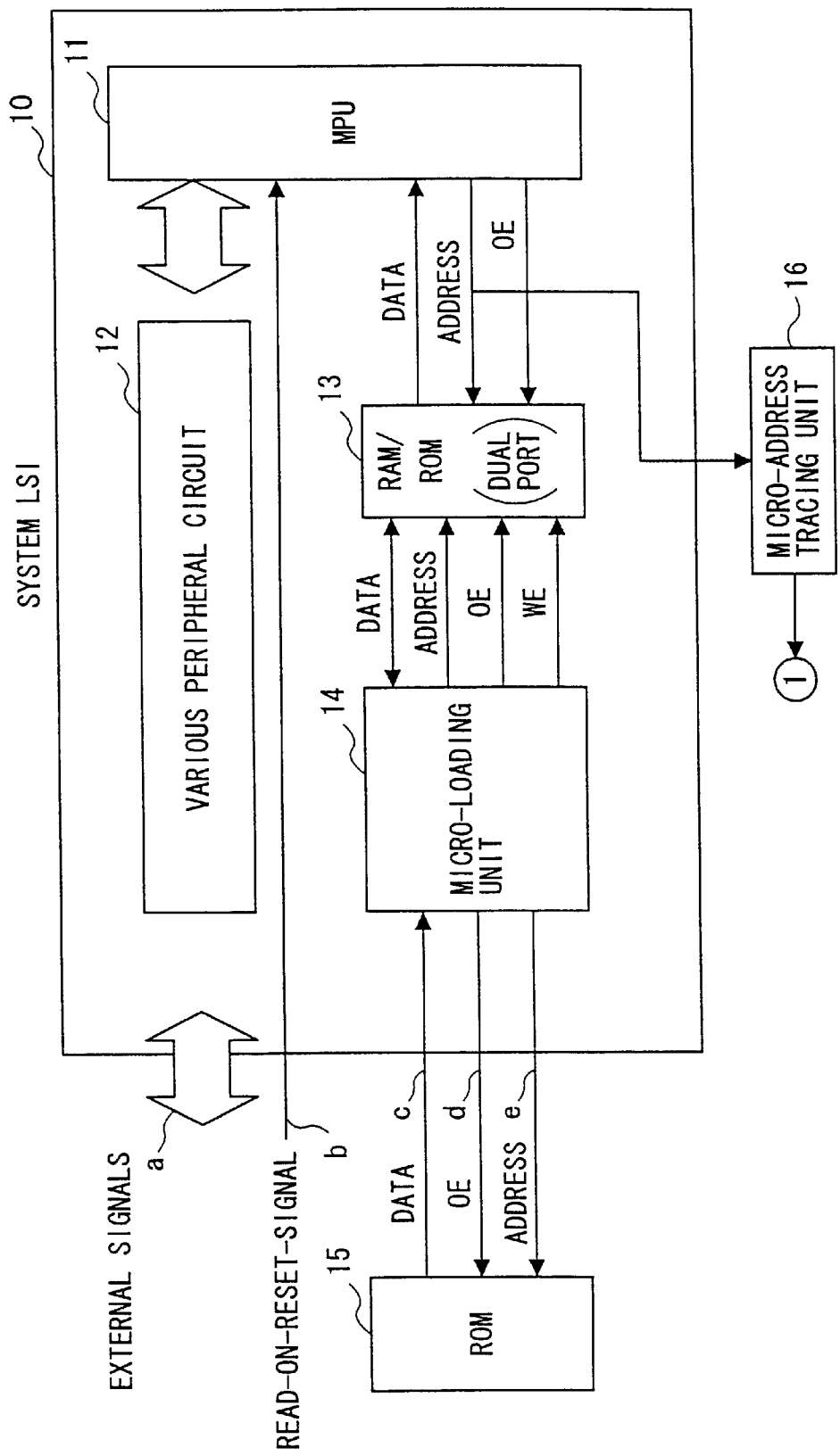
FIG. 2 is an illustrative drawing for explaining a method of generating test data according to the present invention.
Figure 3:
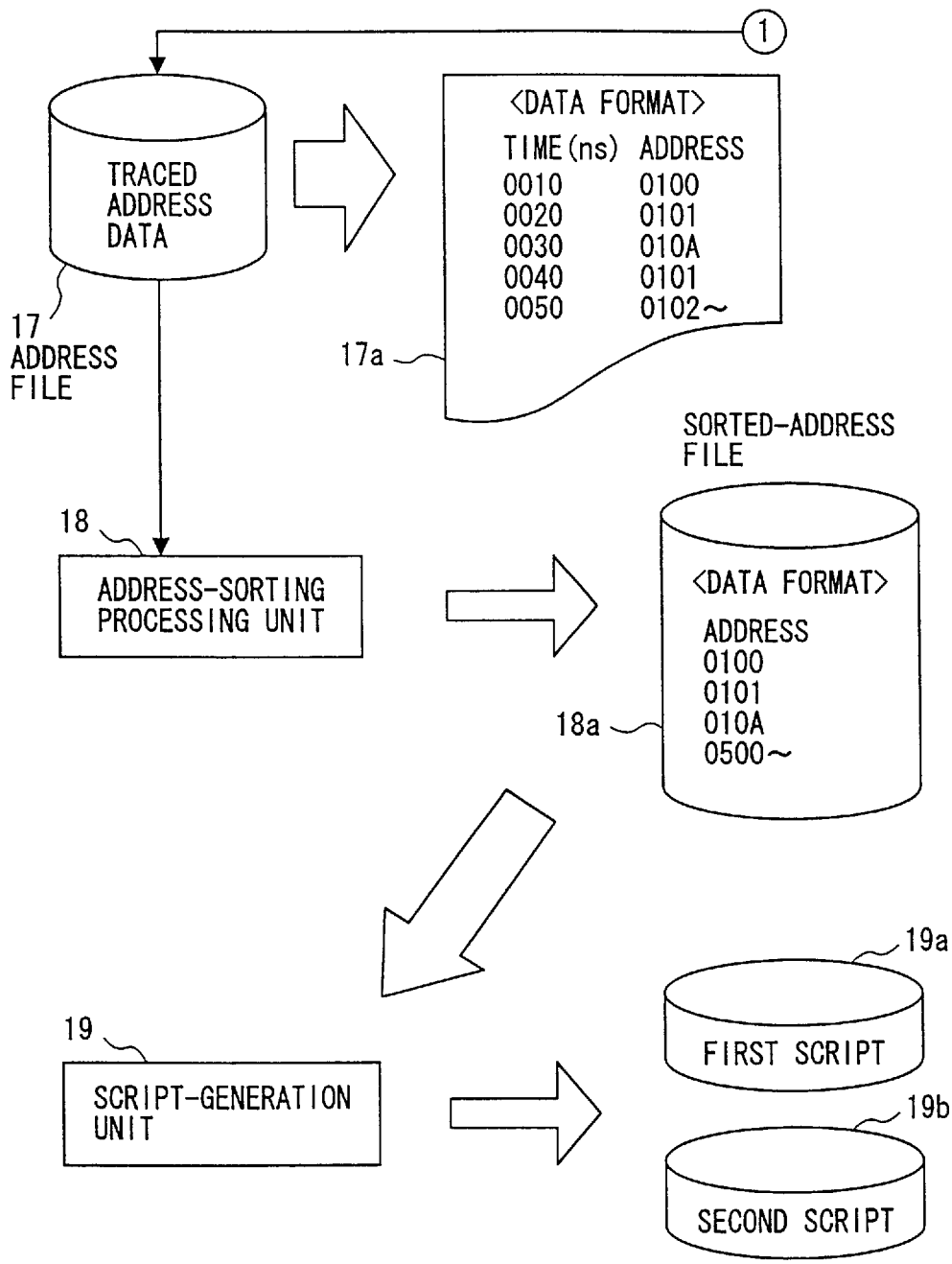
FIG. 3 is also an illustrative drawing for explaining the method of generating test data according to the present invention.

FIG. 2 is an illustrative drawing for explaining the method of generating test data according to the present invention. FIG. 3 is also an illustrative drawing for explaining the method of generating test data according to the present invention.

FIG. 2 shows a model of a system LSI circuit connected to a ROM where the model is subjected to simulation on the workstation. A system LSI circuit 10 includes an MPU 11, various peripheral circuits 12, a RAM/ROM 13, and a micro-loading unit 14. The system LSI circuit 10 is connected to a ROM 15 and to a micro-address tracing unit 16. In an actual (physical) LSI, a RAM is used in place of the RAM/ROM 13. During the simulation, however, the RAM/ROM 13 is treated as a dual port ROM. The micro-loading unit 14 attends to the sequence control of micro-program loading. The ROM 15 stores micro-program. The micro-address tracing unit 16 traces addresses of the micro-program that are used during simulation tests of the system LSI circuit 10.

In FIG. 3, an address file 17 stores therein data of traced addresses. An address-sorting processing unit 18 sorts the traced addresses, and attends to other processing such as elimination of duplicate addresses. A script-generation unit 19 generates scripts for loading only the necessary addresses of the micro-program. The address file 17 has a data format 17a, for example. Traced addresses after sorting are stored as a sorted-address file 18a. A first script 19a is a control file that specifies timings of loading operation. A second script 19b is a ROM-data file that specifies addresses to be loaded to the internal RAM (i.e., the RAM/ROM 13).

The system LSI circuit 10 receives various external signals through signal lines a. Further, a signal line b supplies a power-on-reset signal to the system LSI circuit 10. The micro-loading unit 14 and the ROM 15 are connected via signal lines c, d, and e, which convey a data signal, an output-enable signal OE, and an address signal, respectively.

In what follows, operation of the embodiment will be described with reference to FIG. 2 and FIG. 3.

At the start of simulation, the RAM/ROM 13 is treated as a ROM that stores therein all the instructions of a micro-program. During an actual test using an actual (physical) LSI circuit, the RAM/ROM 13 will be a RAM, and the micro-program is stored in the external ROM 15 to be loaded to the RAM/ROM 13 that is an internal RAM. During the simulation for generating test data, however, the RAM/ROM 13 is treated as a ROM that stores therein the micro-program, which is referred to as the ROM-modeling of the micro-program.

The MPU 11 operates based on the micro-program stored in the RAM/ROM 13. The MPU 11 executes a simulation program that simulates operations of the system LSI circuit 10 that are to be performed during an actual test of an actually manufactured LSI circuit 10. While the MPU 11 executes this simulation program, input and output signals appearing at terminals of the system LSI circuit 10 are recorded as test data. In order to execute the simulation program, the MPU 11 asserts the output enable signal OE to the RAM/ROM 13 so as to read the micro-program therefrom. The micro-address tracing unit 16 traces addresses supplied from the MPU 11 to the RAM/ROM 13 during the simulation, and generates a text data indicative of the traced addresses. The text data is stored as the address file 17 shown in FIG. 3.

As shown in the data format 17*a* of the address file 17, the traced addresses are recorded together with corresponding time marks, which indicate timings at which these addresses are accessed. The address-sorting processing unit 18 then edits the text of the address file 17 by eliminating duplicate addresses and sorting the addresses in an ascending or descending order, thereby generating the sorted-address file 18*a*. Elimination of duplicate addresses is necessary since mere sorting of the addresses would result in identical addresses appearing more than once in the resulting sorted-address file.

After this, the script-generation unit 19 generates the first and second scripts by using the sorted-address file 18*a*. The first script 19*a* indicates timings at which data of the micro-program is transferred from the external ROM to the internal RAM. The second script 19*b* is ROM data that indicates addresses of micro-program data to be transferred from the external ROM to the internal RAM. These scripts are interpreted by the micro-loading unit 14, so that the micro-loading unit 14 transfers the micro-program from the ROM 15 to the RAM/ROM 13 serving as a RAM. Such transfer of the micro-program takes place toward the end of the simulation for generating test data after these scripts are generated. By following the generated scripts, only a portion of the micro-program that is no more than necessary is transferred, and a final test of the simulated operation is conducted. Also at a subsequent actual test, the portion of the micro-program that is no more than necessary is transferred by following the scripts.

In the present invention, information about the sorted addresses is converted into the scripts, which control the operation of writing data in the internal RAM of the system LSI circuit 10. Since the addresses to be written are not sequential (i.e., are not successive addresses), these scripts must specify timings in addition to the non-sequential addresses to be transferred, so that these addresses are supplied at proper timings. Details of this point will be described in the following.

Figure 4:
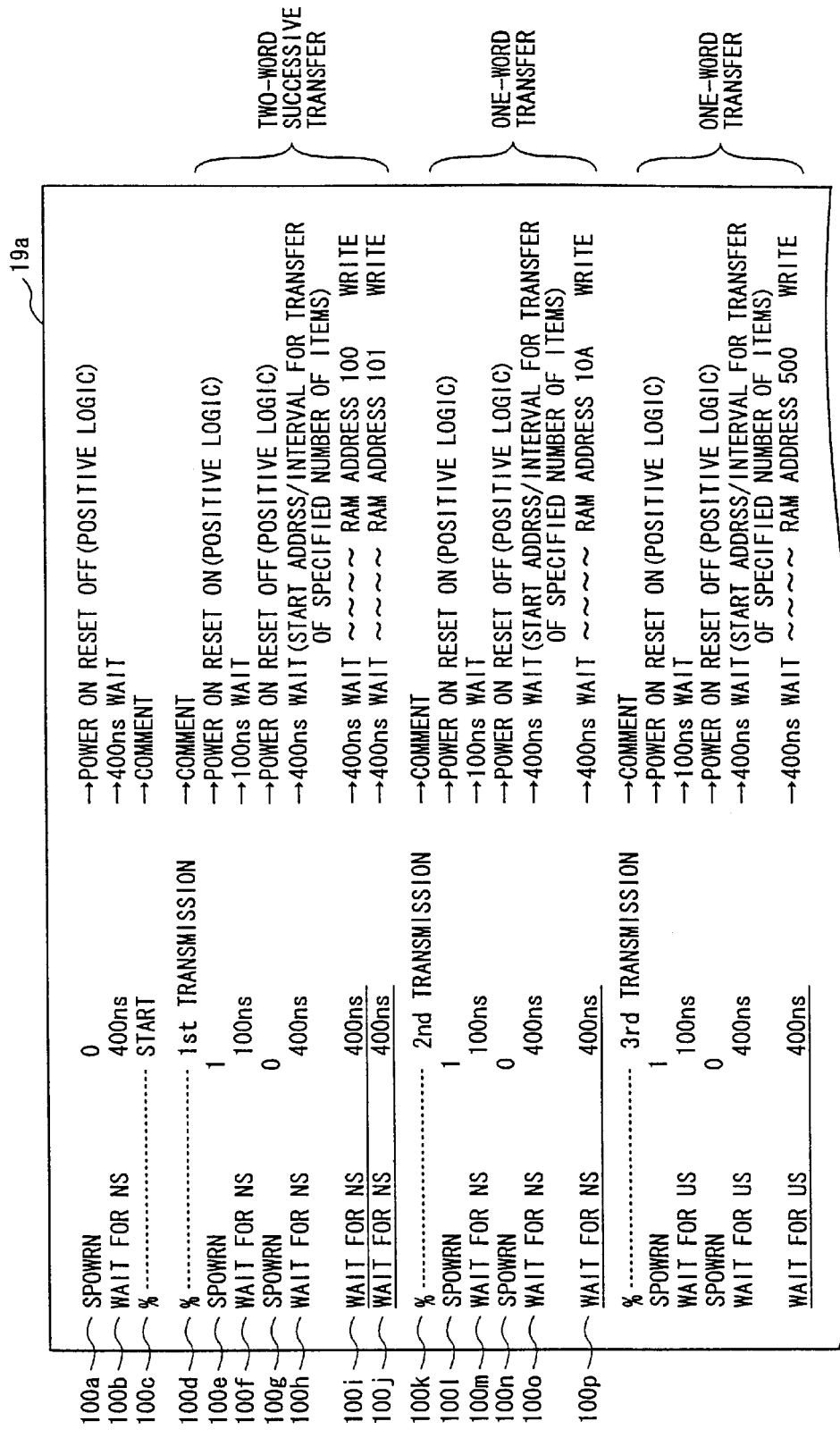
FIG. 4 is an illustrative drawing showing an example of a first script.

FIG. 4 is an illustrative drawing showing an example of the first script.

The first script 19*a* specifies timings of the power-on-reset signals by defining wait periods for transferring a specified number of data words during data transfer from the external ROM to the internal RAM. The example of FIG. 4 corresponds to address data shown in the sorted-address file 18*a* shown in FIG. 3. It should be noted that the power-on-reset signal needs to be supplied to the micro-loading unit 14 each time a series of successive addresses are to be written in the RAM. If all the successive addresses of the micro-program are sequentially written in the RAM as in the related art, the power-on-reset signal needs to be supplied only once at the beginning of transfer. Since the data transfer is not sequential in the present invention, however, the power-on-reset signals need to be supplied as many times as necessary at proper timings.

In the script of FIG. 4, "SPOWRN 0" indicated as 100*a* means that the power-on-reset signal is in an off state. "WAIT FOR NS 400 ns" referred to as 100*b* indicates that 400 ns are let pass. "%" shown as 100*c*, 100*d*, and 100*k* is a comment mark followed by such a comment as "Start" or "First Transmission". "SPOWRN 1" through "WAIT FOR NS 400 ns" respectively indicated as 100*f* through 100*h* means that the power-on-reset signal is on for 100 ns, and, then, a 400-ns period is let pass. This time period is provided for indicating a start address and a number of transferred words that are to be written in the RAM. "WAIT FOR NS 400 ns" referred to as 100*i* and 100*j* sets aside a 400-ns time period for transfer of a RAM address "100" and transfer of a RAM address "101", respectively.

By the same token, the script lines from 100*l* through 100*p* define timings of a power-on-reset signal, a start address, a number of transferred words, and a time period of data transfer. These script lines correspond to a case in which only one word is transferred.

Figure 5:
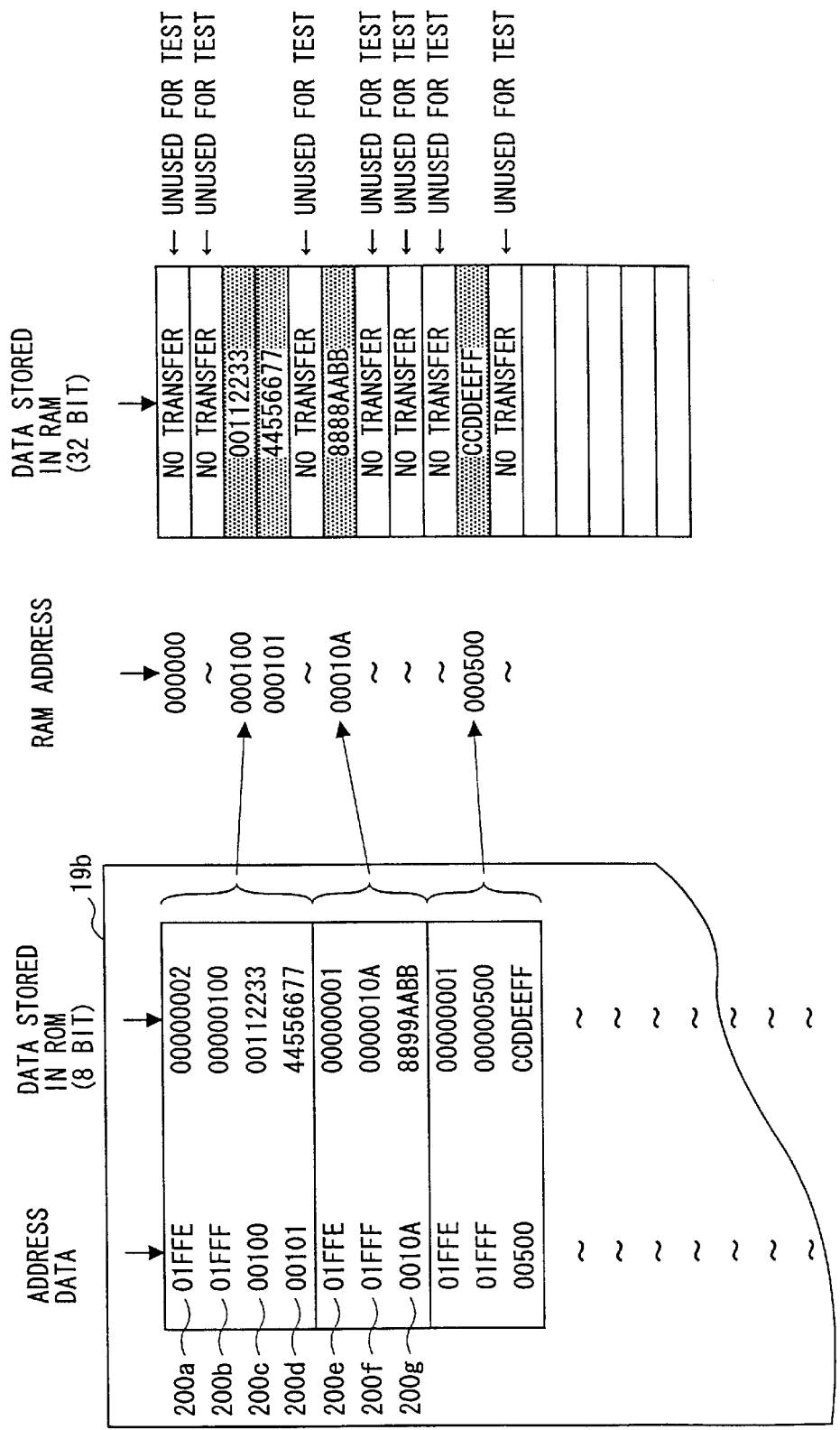
FIG. 5 is an illustrative drawing for explaining a second script and the transfer of data.

FIG. 5 is an illustrative drawing for explaining the second script and the transfer of data.

The second script 19*b* shown in FIG. 5 is stored in the ROM 15 external to the system LSI circuit 10, and specifies addresses and data stored in these addresses. In this example, data transfer is carried out by a unit of 8 bits. A bit pattern "01FFE" shown as 200*a* is an indication that the corresponding data specifies the number of transferred words. Here, one word is 4 bytes. In this case, the corresponding data is "00000002", which indicates that the number of transferred words is 2. A next bit pattern "01FFF" referred to as 200*b* indicates that the corresponding data specifies a start address of an address area in which addresses are written in the RAM/ROM 13. In this case, the corresponding data is "00000100", indicating that the transferred data is stored at the address "00000100" and thereafter. Addresses "00100" and "00101" shown as 200*c* and 200*d*, respectively, store respective data items "00112233" and "44556677". These data items are transferred to the RAM/ROM 13, and are stored at addresses "000100" and "000101".

The script lines 200*e* through 200*g* of the second script 19*b* indicate the data transfer of one word, a start address of "0000010A", and a transfer data word of "8899AABB". According to this script, the data word "8899AABB" is transferred to the RAM/ROM 13, and is stored at the address "0000010A". As is understood from FIG. 5 by inspecting RAM addresses where data are written, only data items that were used during the simulation of LSI testing are selectively transferred, and remaining data of unused addresses are not subjected to the transfer operation.

Figure 6:
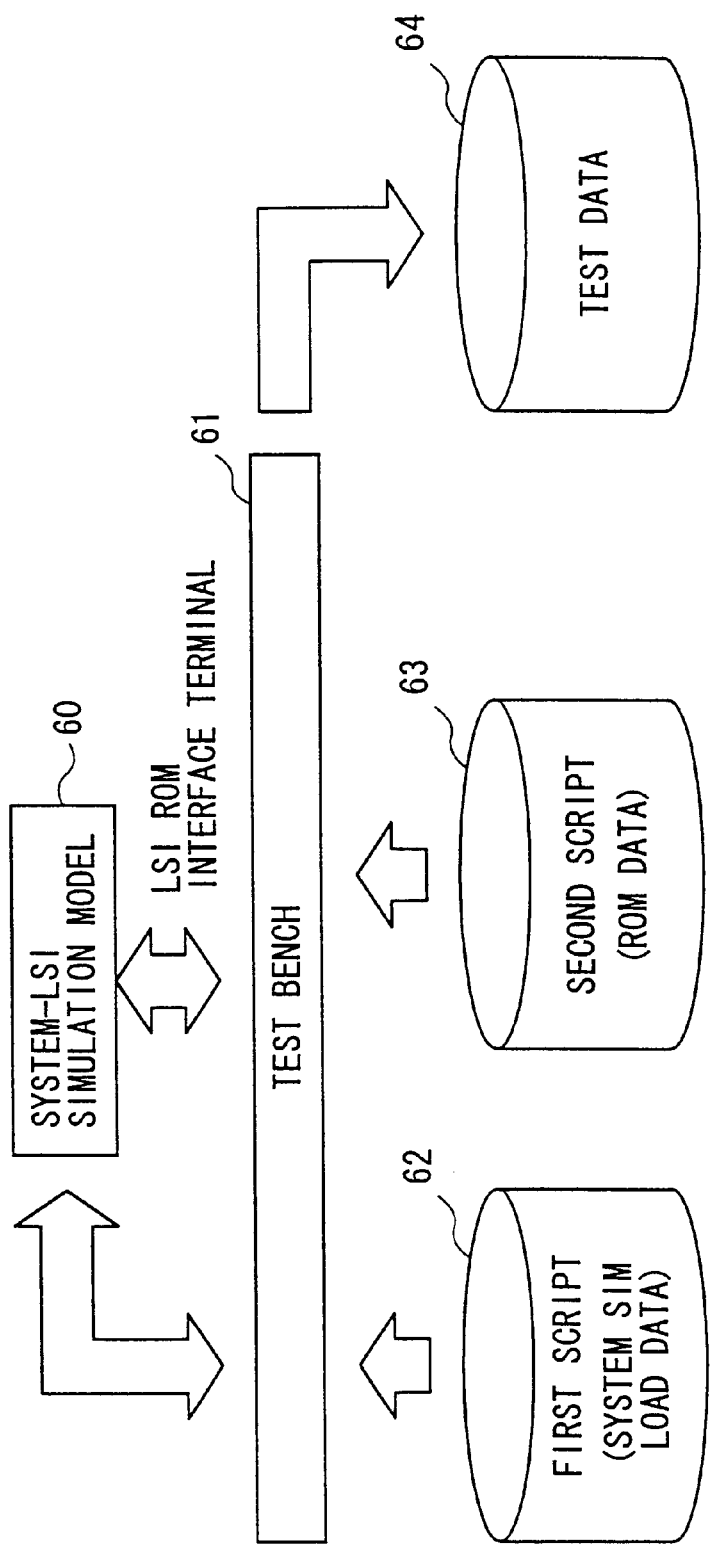
FIG. 6 is an illustrative drawing showing a process of generating test data based on the scripts.

FIG. 6 is an illustrative drawing showing a process of generating test data based on the scripts.

In FIG. 6, a system-LSI simulation model 60 is controlled by a test bench 61, which is a set of programs for simulating tests that are to be carried out by an LSI tester. A first script 62 (of the same type as the first script 19*a*) and a second script 63 (of the same type as the first script 19*b*) are used by the test bench 61 to transfer the micro-program from the external ROM to the internal RAM. Simulation of the tests that are to be carried out by an LSI tester is performed based on the micro-program, and the input/output data of the system-LSI simulation model 60 are recorded together with time marks to generate test data 64.

FIG. 7 is a timing chart indicative of operation of the micro-loading unit 14. This timing chart corresponds to the first and second scripts generated by the script-generation unit 19.

A cycle t1 corresponds to an on-state of the power-on-reset signal, which lasts for 100 ns. This 100-ns active period of the power-on-reset signal corresponds to the script lines 100e, 100f, and 100g shown in FIG. 4. As shown in FIG. 7, a start address is indicated by data that is read from the ROM at cycles t2 and t3. As previously described, the second script specifies the start address of each transfer operation. Further, the number of words to be transferred is specified at cycles t4 and t5. In this example, the number of words to be transferred is 2, which is equivalent to 4×2 bytes. Thereafter, 4 bytes of data are transferred to the specified RAM address from the cycle t6 to the cycle t9. The second script also specifies what data is to be transferred. At the cycle t9, one word of data is written in the RAM. Next four bytes are transferred from the cycle t10 to the cycle t13, and are written as one word at the specified RAM address at the cycle t13.

If data of the following successive addresses were to be transferred, a next on-status of the power-on-reset signal would not take place at a cycle t14. Since data transfer is not successive in this case, the power-on-reset signal becomes "on" at the cycle t14 immediately following the last data transfer. After the cycle 14, data transfer is carried out as specified in the scripts.

In this manner, the scripts for controlling the transfer of micro-program from the external ROM to the internal ROM are generated from addresses traced during simulation of LSI testing. Use of these scripts makes it possible to transfer only the data of addresses that are no more than necessary at the time of actual LSI testing.

FIGS. 8A and 8B are illustrative drawings for explaining shortening of the simulation time.

Figure 12A:
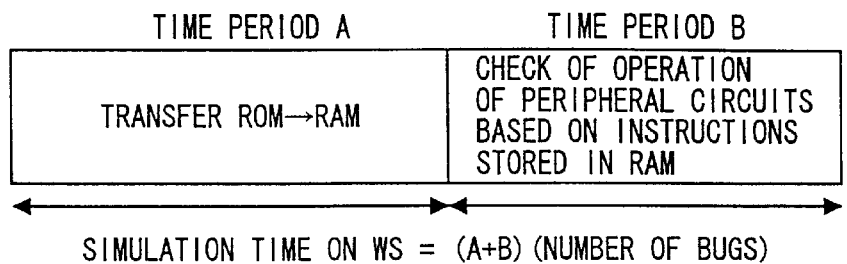
FIGS. 12A and 12B are illustrative drawings for explaining the drawbacks of the related art.
Figure 12B:
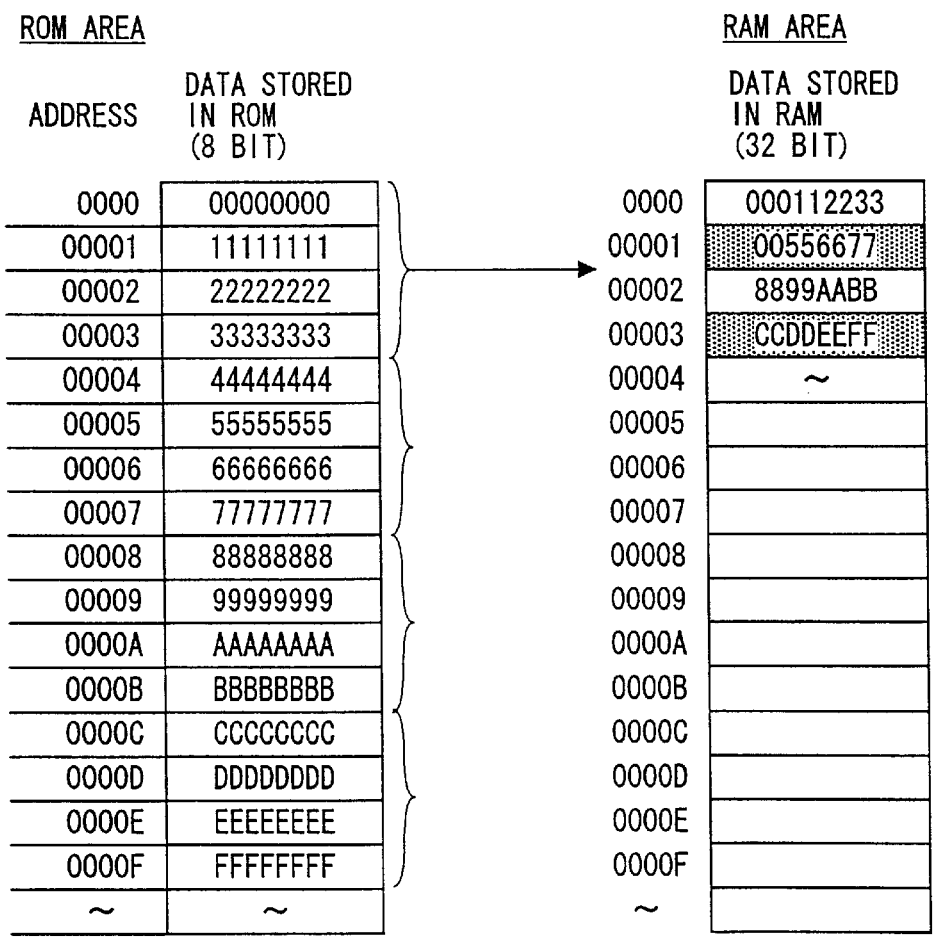

FIG. 8A shows a time length of the process that generates test data. As shown in FIG. 8A, a time period B is a time period during which the test of the LSI circuit is conducted based on the ROM model of the micro-program. The process of the time period B is repeated as many times as debugging operations are repeated. A time period A is a time period during which data of the micro-program is transferred from the external ROM to the internal RAM. Since the amount of data to be transferred is no more than necessary for conducting the test, loading of excessive portions of the micro-program is avoided to reduce the transfer time. As a result, the total length of the simulation is equal to the time period B×(number of debugging operations)+the time period A. As is apparent from comparison with FIG. 12A, the time length of simulation is significantly shortened. (To be exact, a final test of the simulated LSI model is conducted after the transfer of data from the external ROM to the internal RAM.) FIG. 8B further illustrates this point. In FIG. 8, only the portion of the micro-program that is no more than necessary for the LSI test is transferred to the RAM, thereby reducing the time length of the simulation.

According to the present invention, the total time length of simulation can be shortened. Even the actual chip test by use of an LSI tester can be faster because of transfer of only a minimum and required portion of the micro-program. The actual chip test may be completed within a time period that is reduced by 30% to 70%.

The total time length y of simulation on the workstation is represented as:

$y=(a+b)x$: Related Art $y=ax+b$: Present Invention where the time period a is spent testing the circuit, and x is the number of bugs (i.e., the number of corrections), with b indicating the time period of data transfer. As is apparent from the above equations, the present invention can reduce the simulation time significantly compared with the related art.

Further, the present invention is not limited to these embodiments, but various variations and modifications may be made without departing from the scope of the present invention.

The present application is based on Japanese priority application No. 11-344264 filed on Dec. 3, 1999, with the Japanese Patent Office, the entire contents of which are hereby incorporated by reference.

What is claimed is:

1. A method of generating test data for conducting a test of an LSI circuit, based on a model of the LSI circuit that has a processor therein operating based on a micro-program, comprising the steps of:

ROM-modeling the micro-program which is already debugged during logic simulation that determines logic design of the LSI circuit; and debugging the micro-program after the ROM-modeling and the LSI circuit by carrying out said test of the LSI circuit on the model of the LSI circuit as a computer software simulation, thereby generating said test data for conducting said test.

2. A method of generating test data for conducting a test of an LSI circuit, based on a model of the LSI circuit that has a processor therein operating based on a micro-program stored in a RAM, comprising the steps of:

carrying out said test of an LSI circuit on the model of the LSI circuit as a computer software simulation, thereby generating said test data for conducting said test of the LSI circuit as a real hardware test;

tracing addresses of the micro-program that are accessed during said test as said computer hardware simulation; and generating a control file from the traced addresses, said control file controlling data transfer of the micro-program from an external ROM to the RAM so as to transfer only a portion of the micro-program that is no more than necessary for conducting said test.

3. A method of generating test data for conducting a test of an LSI circuit, based on a model of the LSI circuit that has a processor therein operating based on a micro-program stored in a RAM, comprising the steps of:

ROM-modeling the micro-program which is already debugged during logic simulation that determines logic design of the LSI circuit;

carrying out said test of an LSI circuit on the model of the LSI circuit as a computer software simulation, thereby generating said test data for conducting said test of the LSI circuit as a real hardware test;

debugging the micro-program after the ROM-modeling and the LSI circuit during said test as said computer software simulation;

tracing addresses of the micro-program that are accessed during said test as said computer software simulation; and generating a control file from the traced addresses, said control file controlling data transfer of the micro-program from an external ROM to the RAM so as to transfer only a portion of the micro-program that is no more than necessary for conducting said test.

4. The method as claimed in claim 3, further comprising a step of eliminating duplicate addresses from the traced addresses and sorting the traced addresses before said step of generating a control file.

5. The method as claimed in claim 3, wherein said step of generating a control file includes the steps of:

generating timings of power-on-reset signals;

generating data indicative of a start address of each transfer operation; and generating data indicative of a number of data items that are to be transferred during each transfer operation.

6. A apparatus for generating test data for conducting a test of an LSI circuit, based on a model of the LSI circuit that has a processor therein operating based on a micro-program stored in a RAM, comprising:

a ROM-modeling unit which performs ROM-modeling of the micro-program, the micro-program being already debugged during logic simulation that determines logic design of the LSI circuit;

an address-tracing unit which traces addresses of the micro-program accessed during said test of the LSI circuit that is carried out on the model of the LSI circuit as a computer simulation that generates said test data for conducting said test of the LSI circuit as a real hardware test; and a control-file-generation unit which generates a control file from the traced addresses, said control file controlling data transfer of the micro-program from an external ROM to the RAM.

7. A process of manufacturing an LSI circuit that has a processor therein operating based on a micro-program stored in a RAM, comprising the steps of:

determining logic design of the LSI circuit;

generating test data based on a model of the LSI circuit manufacturing the LSI circuit based on the logic design and the determined layout; and conducting a test of the manufactured LSI circuit by utilizing the test data, wherein said step of generating test data includes the steps of:

ROM-modeling the micro-program which is already debugged during the determination of the logic design of the LSI circuit;

carrying out said test on the model of the LSI circuit as a computer software simulation, thereby generating said test data for conducting said test of the manufactured LSI circuit;

debugging the micro-program after the ROM-modeling and the LSI circuit during said test as said computer software simulation;

tracing addresses of the micro-program that are accessed during said test as said computer software simulation; and generating a control file from the traced addresses, said control file controlling data transfer of the micro-program from an external ROM to the RAM so as to transfer only a portion of the micro-program that is no more than necessary for conducting said test.

* * * * *